CHASSIS ASSEMBLY FOR ELECTRONIC DEVICES

Filed March 9, 1967 2 Sheets-Sheet 1

INVENTOR.
KENNETH V. SEELIG

BY T. N. Symmons

ATTORNEY

CHASSIS ASSEMBLY FOR ELECTRONIC DEVICES

Filed March 9, 1967 2 Sheets-Sheet 2

INVENTOR.
KENNETH V. SEELIG
BY T. N. [signature]
ATTORNEY

United States Patent Office 3,386,012

Patented May 28, 1968

3,386,012

CHASSIS ASSEMBLY FOR ELECTRONIC DEVICES

Kenneth V. Seelig, Valley Stream, N.Y., assignor to Riker Video Industries, Inc., Hauppauge, N.Y., a corporation of New York Filed Mar. 9, 1967, Ser. No. 621,887
9 Claims. (Cl. 317—101)

ABSTRACT OF THE DISCLOSURE

A lightweight, portable chassis for housing one or more mounting boards carrying various electronic devices cooperating to provide one or more electronic functions. The present chassis comprises aluminum extrusion elements assembled together to form a generally U-shaped frame presenting a plurality of cooperating grooves which receive and retain cover members and one or more mounting boards. Elements for retaining the mounting boards and covers are provided as well as handles and mounting brackets for respectively carrying the chassis and securing the chassis to a support structure.

*Background of the invention*

This invention relates to electronic apparatus, and more particularly to a versatile chassis assembly for housing various electronic components or devices.

The assembly of numerous electronic equipment or components into a single package accounts for a considerable portion of the cost of labor and materials. One reason for this is that generally the designer and manufacturer provides an individual design for each package which makes each package of electronic equipment essentially a custom built product. Hence, a standardized package would save considerable time and money in such packages of electronic equipment.

*Summary of the invention*

As an overall object, the present invention seeks to provide a lightweight, portable chassis assembly adaptable to house a wide variety of electronic devices and the like.

Another object of the invention is to provide a chassis assembly which is rugged yet attractive and which is relatively inexpensive to manufacture.

Still another object of the invention is to provide a chassis assembly formed in part from extruded aluminum elements adaptable to receive handles for carrying the chassis assembly or assisting in installing the same in support structure, and brackets for assisting in securing the chassis assembly to the support structure.

Yet another object of the invention is to provide a chassis assembly formed in part from extruded aluminum elements having channels or grooves adapting the chassis assembly to be supported for sliding or rolling movement relative to the support structure.

A further object of the present invention is to provide chassis assemblies which may be stacked one above the other and secured together as a unit housing a plurality of the mounting boards.

In accordance with the present invention a chassis assembly is provided comprising a generally U-shaped frame including front and side rails. At least one mounting board is positioned within the frame and retainably supported in grooves provided on the inner faces of the rails. The mounting board is adapted to support electronic devices within the confines of the frame. Cover members are spaced from the opposite faces of the mounting board and retainably supported in other grooves provided on the inner faces of the rails. A strut member extends between and is secured to the side rails adjacent to the rear edge of the mounting boards. The strut member prevents the mounting board from sliding out of the frame. A pair of handles is provided on the front rail of the frame to assist in positioning and inserting the chassis assembly in suitable support structure. In addition, mounting brackets are provided for securing the chassis assembly to the support structure.

The front and side rails have a longitudinal channel in their outer faces which receive the aforesaid handles and mounting brackets. The configuration of the side rails permits the chassis assembly to be mounted on guide rails or rollers carried by the support structure for easy movement relative to the support structure.

Two or more of the present chassis assemblies may be stacked one above the other and secured together as a unit housing a plurality of mounting boards. Alternatively, a plurality of mounting boards may be housed within a single chassis assembly.

*Description of the drawings*

The above and other objects and advantages of the present invention will become apparent from the following detailed description by reference to the following drawings, in which.

*Description of the preferred embodiments*

Figures 1, 13, 14, 15, 16:
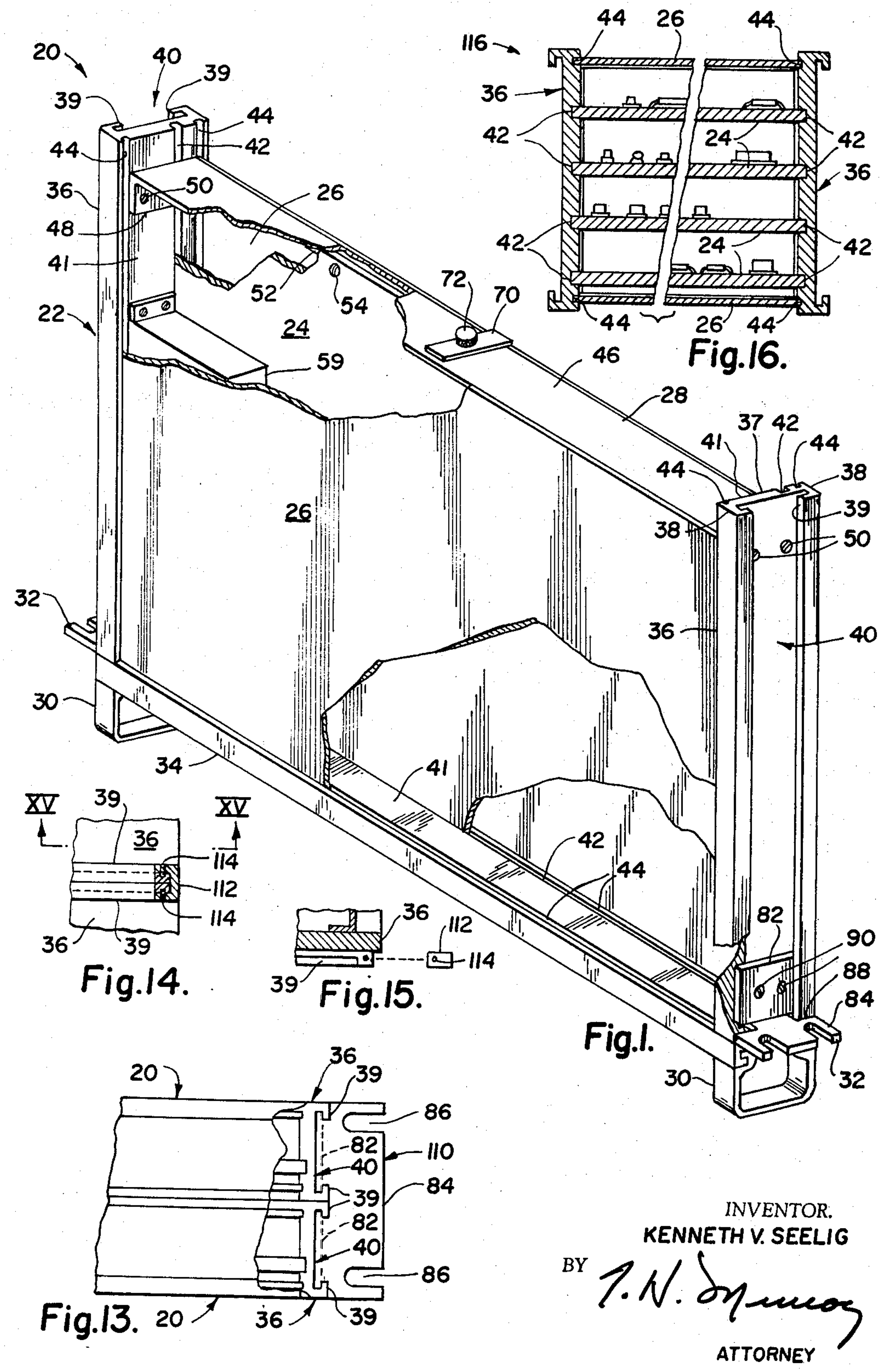
FIGURE 1 is an isometric view of a chassis assembly constructed in accordance with the present invention, which houses a single mounting board.
FIG. 13 is a fragmentary front view of an alternative arrangement illustrating how two or more of the present chassis assemblies may be ganged together.
FIG. 14 is a fragmentary side view illustrating a connector for connecting the ends of the chassis assemblies of FIG. 13.
FIG. 15 is a cross-sectional view, taken along the line XV—XV of FIG. 14, further illustrating the end connector.
FIG. 16 is a transverse cross-sectional view of an alternative embodiment of the present chassis assembly housing a plurality of mounting boards.

Referring now to FIGS. 1–5 inclusive, there is illustrated a chassis assembly 20 comprising in general a generally U-shaped frame 22 carrying a mounting board 24, cover members 26 and a strut member 28 retaining the mounting board within the frame 22. Handles 30 assist in carrying and positioning the chassis assembly 20 during installation and removal from support structure 31 schematically illustrated in FIGS. 2 and 3. Mounting brackets 32 are employed when securing the chassis assembly 20 to the support structure 31.

Figures 2, 3, 4, 5, 6, 7, 8, 9, 10, 11, 12:
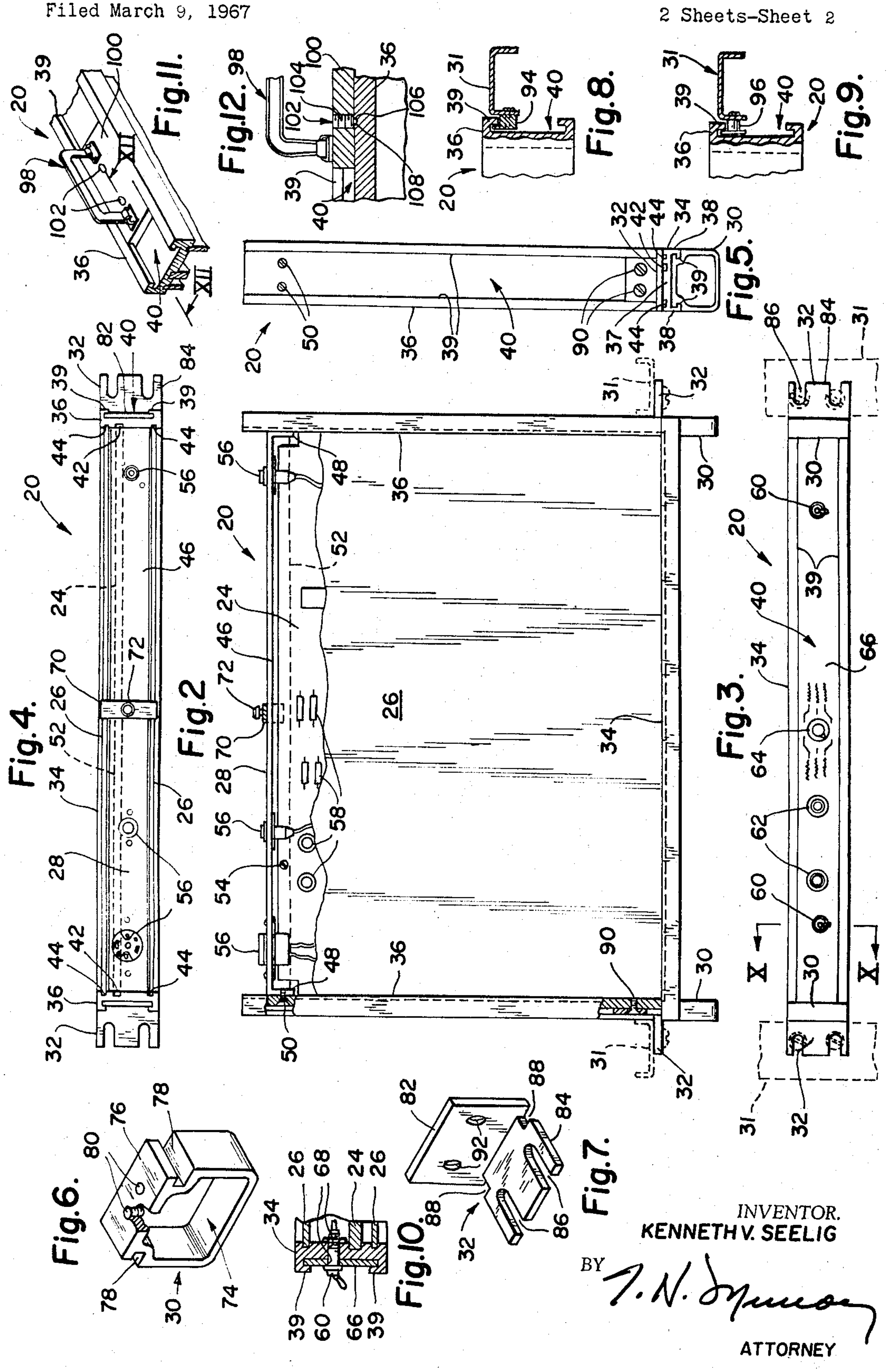
FIGS. 2, 3, 4 and 5 are respectively a plan view, a front view, a rear view and a side view of the chassis assembly of FIG. 1.
FIG. 6 is an isometric view of a handle.
FIG. 7 is an isometric view of a mounting bracket.
FIG. 8 is a fragmentary front view of a side rail illustrating a sliding support for the present chassis assembly.
FIG. 9 is a fragmentary side view, similar to FIG. 8, illustrating a roller support for the present chassis assembly.
FIG. 10 is a fragmentary cross-sectional view taken along the X—X line of FIG. 3.
FIG. 11 is a fragmentary isometric view of a side rail of the present chassis provided with a detachable handle.
FIG. 12 is a cross-sectional view, taken along the line XII—XII of FIG. 11, illustrating one method of detachably connecting the handle to the side rail.

The U-shaped frame 22 includes a front rail 34 and side rails 36 which are butt welded or otherwise secured to the ends of the front rail 34. The rails 34, 36 are preferably formed from aluminum and comprise appropriate lengths of a single extrusion, i.e., the front rail 34 and side rails 36 are identical. As can be seen in FIGS. 1 and 5, the rails 34, 36 include a central web 37 having side walls 38 along its opposite edges and reentrant flanges or lips 39 on the side walls 38 and spaced from the central web 37. The central web 37, the side walls 38 and the lips 39 define an external longitudinal channel 40.

In addition, the rails 34, 36 have inner faces 41 provided with internal longitudinal grooves 42 which receive and retain the edges of the mounting board 24; and internal longitudinal grooves 44 receiving and retaining the edges of the cover members 26. The mounting board 24 and the cover members 26 are individually slideable into and out of the frame 22.

The strut member 28 comprises a strut portion 46 extending between the side rails 36 and terminating in downturned ends 48 detachably secured to the side rails 36 by fasteners 50. The strut member 28 is positioned over the rear edge of the mounting board 24 and includes a longitudinal flange 52 to which the mounting board 24 is secured by fastener 54. As can best be seen in FIGS. 2 and 4, the strut portion 46 serves to seal the rear portion of the chassis assembly 20 as well as support various electrical connectors and the like schematically illustrated at 56. The electrical connectors 56 are associated with electronic devices 58 (FIG. 2) carried by the mounting board 24. In addition, as shown in FIG. 1, other devices, such as a transformer 59 may be secured to one of the side rails 36 and reside within the confines of the chassis assembly 20.

Connected to the electronic devices 58 are various control elements, such as switches 60, fuses 62 and a central knob 64, shown in FIG. 3, which are displayed on the front rail 34. As shown in FIGS. 3 and 10, a decorative front panel 66 resides in the channel 40 of the front rail 34 and is retained by the lips 39. The control elements, such as the switch 60 (FIG. 10) are inserted through corresponding opening 68 provided in the front rail 34 and the panel 66.

Interconnection of the electrical connectors 56 and the control elements 60, 62 and 64 with the electronic devices 58 is accomplished with the cover members 26 removed. After the connections have been made, the cover members 26 are slid into the longitudinal grooves 44. A clip 70 is applied over the strut member 28 and the cover members 26 and secured to the strut member 28 by a fastener 72.

Referring now to FIG. 6, the handles 30 have an opening 74 of a convenient size for easy grasping. The handles 30 also have a base 76 provided with grooves 78 which receive the lips 39 when the handle 30 is slid into the channel 40 of the front rail 34 as best shown in FIG. 5. The base 76 is also provided with set screws 80 for securing the handle 30 to the front rail 34. The handles 30 are most conveniently made by cutting an aluminum extrusion having a cross-section as shown in FIG. 6.

Referring now to FIG. 7, the mounting bracket 32 comprises a base plate 82 and a mounting plate 84 provided with notches 86 and slots 88. The base plate 82 is slid into the channel 38 of the slide rails 36 and extends beneath the lips 39, the lips 39 being received in the slots 88 as shown in FIG. 1. Fasteners 90 (FIGS. 1 and 2) pass through openings 92 in the base plate 82, to secure the mounting bracket 32 to the side rails 36. Again, the mounting brackets 32 are readily formed by cutting appropriate lengths of an angle-shaped aluminum extrusion with only drilling and notching being required as additional operations.

The lips 39 and the channel 40 of the side rails 36 permit the chassis assembly 20 to be readily supported for easy movement into and out of suitable support structure. For example, as can be seen in FIG. 8, the support structure 31 may be provided with guide tracks 94 (only one shown), each of which fits into the channel 40 beneath the lip 39. The chassis assembly 20 may be slid on the guide track for easy installation and withdrawal. Alternatively, as shown in FIG. 9, the support structure 31 may be provided with rollers 96 (only one shown), which fit into the channel 40 beneath the lip 39. Again, the chassis assembly 20 may be slid over the rollers 96 for easy installation and withdrawal, as required.

In order to make the chassis assembly 20 more readily portable, a detachable handle 98 (FIGS. 11 and 12) may be provided having a plate 100 adapted to fit into the channel 40 and extend beneath the lips 39 of one of the side rails 36. Connecting means 102 are provided for detachably connecting the handle 98 to the side rail 36. The connecting means 102 may comprise a connector of the type having a threaded housing 104 threaded into the plate 100 and containing a spring loaded ball 106 received in a dimple 108 provided in the side rail 36. Other means may be provided for detachably connecting the handle 98 to the side rail 36. The handle 98 is preferably positioned such that the weight of the chassis assembly 20 is distributed evenly on both sides of the handle 98 for ease in carrying the chassis assembly 20.

Alternative embodiments of the present chassis assembly will now be described with reference to FIGS. 13–16. Corresponding numerals will be employed to identify corresponding parts heretofore described.

Referring now to FIGS. 13–15, there are shown two of the chassis assemblies 20 stacked one above the other in front rail-to-front rail and side rails-to-side rails relation. The chassis assemblies 20 are connected together by means of a pair of mounting brackets 110 similar to the mounting bracket 32 (FIG. 1). Each of the mounting brackets 110 includes two base plates 82 residing in the channels 40 and extending beneath the lips 39 of the adjacent side rails 36; and a single mounting plate 84 provided with notches 86. The mounting brackets 110 are conveniently formed by cutting appropriate lengths of an angle-shaped aluminum extrusion with only drilling and notching being required as additional operations. As shown in FIGS. 14 and 15, the ends of the adjacent side rails 36 may be connected by means of a C-shaped connector 112 and set screws 114. The connector 112 may comprise segments of an aluminum extrusion.

Referring now to FIG. 16, there is illustrated a chassis assembly 116 having wide side rails 36 and a wide front rail 34 (not shown). The wide side rails 36 includes longitudinal grooves 44 receiving the cover members 26. In addition, the wide side rails 36 include a plurality of corresponding longitudinal grooves 42 receiving a plurality of the mounting boards 24. The chassis assembly 116 has the advantage of housing a plurality of the mounting boards 24 in a single assembly 116.

From the foregoing detailed description, it should be readily apparent that the present invention provides a chassis assembly which is adaptable to house various electronic devices; which is rugged yet attractive and which is relatively inexpensive to manufacture, inasmuch as it is fabricated from mass produced aluminum extrusions requiring a minimum of fabricating operations. In addition, the present chassis assembly is lightweight, readily portable and may be fabricated to house one or more mounting boards, each of which supports numerous electronic devices.

Although the invention has been shown in connection with certain specific embodiments, it will be readily apparent to those skilled in the art that various changes in form and arrangement of parts may be made without departing from the spirit and scope of the invention.

I claim as my invention:

1. A lightweight, portable chassis assembly for housing electronic components, comprising: a generally U-shaped frame including front and side rails, each of said side rails having an external longitudinal channel defined by reentrant flanges; at least one mounting board retainably supported between and by said rails within said frame; said mounting board being adapted to support electronic devices within the confines of said frame; cover members spaced from the opposite faces of said mounting board and retainably supported between and by said rails within said frame; a strut member detachably secured to said side rails, said strut member having a strut portion positioned adjacent to a rear edge of said mounting board and preventing inadvertents removal of said mounting board; and at least one handle engaging one said longitudinal channel and secured to said frame.

2. The chassis assembly defined in claim 1 wherein said front rail and said side rails comprise aluminum extrusions.

3. The chassis assembly defined in claim 1 wherein said front rail and said side rails comprise segments of a single aluminum extrusion.

4. The chassis assembly defined in claim 1 wherein said rails have longitudinal grooves in their inner faces, the edges of said mounting board and said cover members being slideably retained in corresponding ones of said longitudinal grooves.

5. The chassis assembly defined in claim 1 including two handles having bases received in said longitudinal channel, and slots receiving said reentrant flanges to slideably connect said handles to said front rail, and including means for securing said handles to said front rails.

6. The chassis assembly defined in claim 1 wherein said handle is detachably connected to one of said side rails.

7. The chassis assembly defined in claim 1 including a mounting bracket secured to each of said side rails adjacent to said front rail, each mounting bracket including a base plate residing in said longitudinal channel and extending beneath said reentrant flanges, and a mounting plate projection from said base plate.

8. The chassis assembly defined in claim 1 including at least a second chassis assembly overlying the first said chassis assembly in front rail-to-front rail and side rails-to-side rails correspondence; and means applied to said side rails for securing said second chassis assembly and the first said chassis assembly together as a unit.

9. The chassis assembly defined in claim 8 wherein said securing means comprises a mounting bracket including a mounting plate projecting from said side rails and base plates extending from said mounting plate and engaged in the longitudinal channels of adjacent side rails of said second chassis assembly and the first said chassis assembly and including means for securing each of said base plates to said side rails.

References Cited

UNITED STATES PATENTS 3,052,821 9/1962 Scoville ------------ 317—101
3,147,402 9/1964 Hochstetler -------- 317—101

ROBERT K. SCHAEFER, *Primary Examiner.*

M. GINSBURG, *Assistant Examiner.*